United States Patent [19]
Boles et al.

[11] Patent Number: 5,976,941
[45] Date of Patent: Nov. 2, 1999

[54] ULTRAHIGH VACUUM DEPOSITION OF SILICON (SI-GE) ON HMIC SUBSTRATES

[75] Inventors: Timothy Boles, Tyngsboro; Matthew F. O'Keefe, Chelmsford; John M. Sledziewski, Newton, all of Mass.

[73] Assignee: The Whitaker Corporation, Wilmington, Del.

[21] Appl. No.: 08/870,219

[22] Filed: Jun. 6, 1997

[51] Int. Cl.⁶ .................................................. H01L 21/44
[52] U.S. Cl. .......................................... 438/349; 438/405
[58] Field of Search ...................... 438/405, 431, 438/481, 349

[56] References Cited

U.S. PATENT DOCUMENTS

| | | | |
|---|---|---|---|
| 4,504,331 | 3/1985 | Kuech et al. | 559/583 |
| 4,592,933 | 6/1986 | Meyerson et al. | 626/504 |
| 4,684,542 | 8/1987 | Jasinski et al. | 895/119 |
| 5,057,450 | 10/1991 | Bronner et al. | 678/390 |
| 5,151,383 | 9/1992 | Meyerson et al. | 307/154 |
| 5,181,964 | 1/1993 | Meyerson | 537/180 |
| 5,234,846 | 8/1993 | Chu et al. | 876/597 |
| 5,241,131 | 8/1993 | Bakhru et al. | 868/371 |
| 5,259,918 | 11/1993 | Akbar et al. | 714/297 |
| 5,273,829 | 12/1993 | Bassous et al. | 774/10 |
| 5,283,456 | 2/1994 | Hsieh et al. | 900/38 |
| 5,294,558 | 3/1994 | Subbanna | 69/337 |
| 5,298,452 | 3/1994 | Meyerson | 841/192 |
| 5,315,151 | 5/1994 | Hsieh et al. | 20/896 |
| 5,322,813 | 6/1994 | Beach | 940/416 |
| 5,331,199 | 7/1994 | Chu et al. | 46/709 |
| 5,340,759 | 8/1994 | Hsieh et al. | 113/941 |
| 5,352,912 | 10/1994 | Crabbe et al. | 792/493 |
| 5,357,899 | 10/1994 | Bassous et al. | 120/290 |
| 5,369,049 | 11/1994 | Acocella et al. | 169/873 |
| 5,371,022 | 12/1994 | Hsieh et al. | 203/129 |
| 5,384,277 | 1/1995 | Hsu et al. | 169/875 |
| 5,385,850 | 1/1995 | Chu et al. | 652/339 |
| 5,446,312 | 8/1995 | Hsieh et al. | 264/885 |
| 5,457,068 | 10/1995 | Malhi et al. . | |
| 5,461,243 | 10/1995 | Ek et al. | 145/986 |
| 5,462,883 | 10/1995 | Dennard et al. | 225/499 |
| 5,534,079 | 7/1996 | Beach | 207/942 |
| 5,534,713 | 7/1996 | Ismail et al. | 246/549 |
| 5,540,785 | 7/1996 | Dennard et al. | 223/98 |
| 5,559,349 | 9/1996 | Cricchi et al. | 257/273 |
| 5,583,059 | 12/1996 | Burghartz . | |
| 5,607,511 | 3/1997 | Meyerson | 186/195 |

*Primary Examiner*—Caridad Everhart
*Attorney, Agent, or Firm*—June B. Schuette

[57] ABSTRACT

The present invention presents a method in which semiconductor heterojunction and homojunction materials are selectively formed on silicon pedestals in an HMIC after the high temperature processing steps in fabricating the HMIC structure are completed.

14 Claims, 2 Drawing Sheets

ULTRAHIGH VACUUM DEPOSITION OF SILICON (SI-GE) ON HMIC SUBSTRATES

FIELD OF THE INVENTION

The present invention relates to a novel technique for application of epitaxial material to form necessary semiconductor interfaces and barriers.

BACKGROUND OF THE INVENTION

The present invention is related to U.S. Provisional Patent Applications Numbers 60/017,120 and 60/013,982 and U.S. Pat. No. 5,268,310 the disclosure of which are specifically incorporated herein by reference. The use of silicon as a material in microwave and of applications in the past had generally been discouraged. This is due to the fact that silicon has a greater electrical conductivity than other materials used in the industry, for example gallium arsenide. This conductivity results in power dissipation and heating effects at high frequencies. Accordingly, gallium arsenide has been the preferred material for fabrication of devices and integrated circuits and the microwave and rf industries. However, in the recent past, heterolithic microwave integrated circuits (HMIC) have been utilized to enable high frequency integrated circuits using silicon as the base material for the circuits. In HMIC applications, silicon pedestals are fabricated having glass material suitable for high frequency application disposed between the pedestals to form the electrical isolation between the pedestals and as the dielectric for signal lines on the integrated circuit. Examples of such HMIC structures are as disclosed above in the above U.S. Provisional Patent Applications, the disclosures of which are specifically incorporated by reference.

While the above referenced patent applications enable reliable high yield and mass produced integrated circuits for applications at high frequency, there are certain drawbacks to fabrication of devices on the integrated circuits described above. To this end, it is often required to have a semiconductor homojunction and heterojunction barrier device fabricated at one or more of the silicon pedestal sites. This is generally done by epitaxial growth of suitably doped Si or Si—Ge on the n$^+$ doped pedestals. During the processing at high temperature, the semiconductor homojunction and heterojunction doping profiles are often degraded. By way of example, the doping profile of an ideal Schottky barrier is as shown in FIG. 4. In the n$^-$ region, the material is lightly doped. A relatively sharp interface is achieved in the high doped substrate region as is shown. The degraded doping profile is as shown superposed on the ideal doping profile. While it is desired to have the silicon based HMIC's, it is none the less required to have a functional homojunction and heterojunction doping profile in many applications. Accordingly, there is a need to fabricate a doping profile at the pedestal/semiconductor barrier which is not degraded during the fabrication of the HMIC.

SUMMARY OF THE INVENTION

The present invention relates to a new process for fabricating HMIC structures having the required epitaxially grown layers on silicon pedestals. The present invention enables the fabrication of semiconductor material interfaces having the desired doping profiles without degradation during the processing. In order to effect this doping profile, the HMIC is fabricated having all of the high temperature processing steps completed prior to deposition of the epitaxial material on the selected surfaces of the silicon pedestals. In this way, the homojunctions and heterojunctions which are often required in HMIC structures are fabricated at a point in processing the HMIC where all deleterious temperature cycles and mechanically challenging steps as described in the above referenced patent applications have been completed. Thereby, junction performance is maintained in the HMIC structure. Furthermore, yield, performance and process simplicity are all improved.

OBJECTS, FEATURES, AND ADVANTAGES

It is an object of the present invention to have a heterolithic microwave integrated circuit where semiconductor heterojunction and homojunction barriers are formed without degradation due to deleterious temperature cycles and mechanically challenging processing steps.

It is a feature of the present invention to have semiconductor heterojunction and homojunction barriers selectively formed on silicon pedestals in an HMIC after the high temperature processing steps in fabricating the HMIC structure are completed.

It is an advantage of the present invention to have an improved yield, performance and process simplicity.

DETAILED DESCRIPTION OF THE INVENTION

Figure 1:
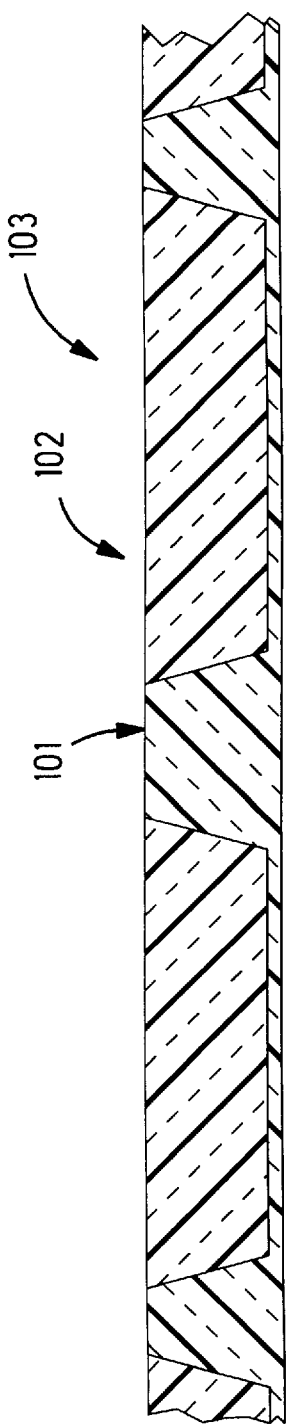
FIG. 1 is the base passive glass substrate having silicon pedestals selectively fabricated therein.
Figure 2:
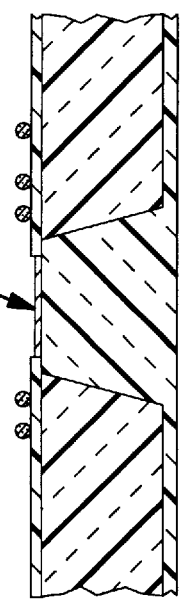
FIG. 2 shows an intermediate step in the fabrication of the integrated circuit of the present invention.
Figure 3:
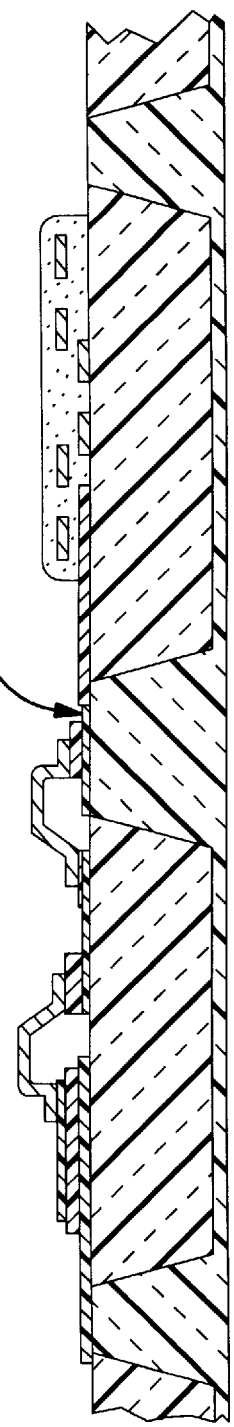
FIG. 3 shows a final result structure having various elements fabricated thereon.
Figure 4:
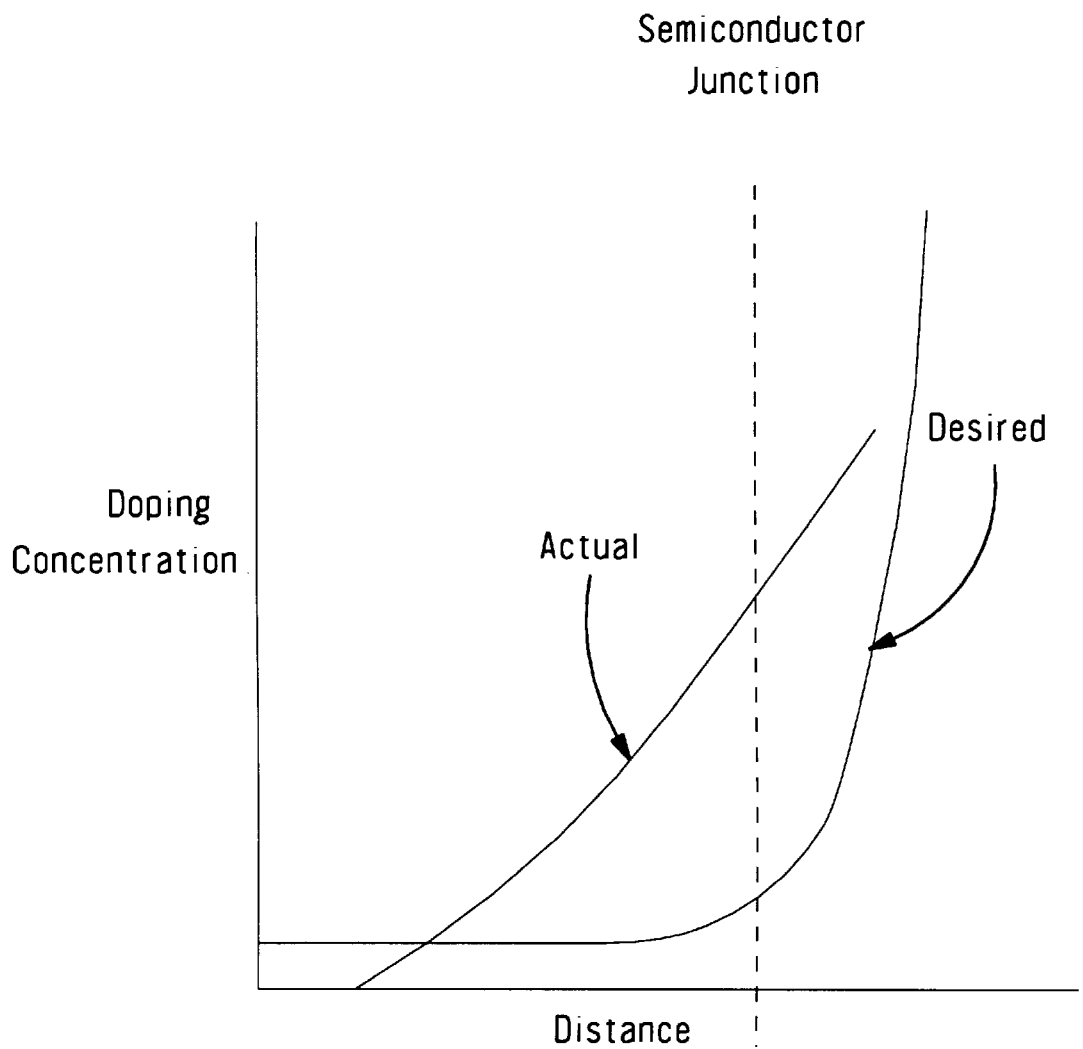
FIG. 4 is a graphic representation of the doping profile of the desired result having the high temperature undesired results superposed thereon.

As stated above, the passive glass substrate of the HMIC is as shown in FIG. 1. This substrate has selectively fabricated silicon pedestals 101 and glass material 102 disposed between the silicon pedestals 101. The passive glass substrate of FIG. 1 is fabricated as is disclosed in the above referenced patent applications to Boles, et al. In order to fabricate the eptiaxial layer of the present invention, a low temperature oxide for example SiO$_x$ or other material such as Si$_3$N$_4$ is deposited on the top surface 103 of the substrate. Thereafter, windows 201 are fabricated on the LTO or other suitable mask material. As is shown in FIG. 2, the LTO mask covers a portion of the top surface of the pedestals, as it is desired to have the epi-layer in a selected portion of the top surface of the pedestal, but not necessarily across the entire top surface of the pedestal. The removal of the selected portion of the oxide to form the windows is done by standard etching techniques. Thereafter, silicon is deposited by standard ultra-high vacuum chemical vapor deposition techniques across the top surface of the substrate, forming epitaxial silicon on the exposed portion of the pedestal, and polysilicon on all other portions. This deposition is pseudoselective in nature, as true selective deposition results in no deposition on the masking areas. However, the windows in the LTO mask where the top surface of the silicon pedestals is found, monocrystalline growth is realized, whereas elsewhere a polycrystalline growth is effected. This poly Si can be readily etched through standard technique. In order to etch the poly Si off of the top surface of the substrate, a protective layer of silicon nitride or other suitable low temperature oxide is deposited across the top surface. Thereafter, the polysilicon is etched off through standard etching techniques. Finally, a standard etching technique is used to remove the low temperature oxide or other suitable material in a manner that will not damage the epitaxially grown layer.

The above description has focused primarily on the fabrication of semiconductor homojunctions, for example schottky barrier devices. Alternatively, heterojunctions can be fabricated through similar techniques to form devices such as bipolar junction transistors. The basic fabrication of semiconductor heterojunctions is as in the fabrication of homojunctions as described above. To this end, the silicon pedestals as desired or fabricated and glass is disposed between the pedestals as described above in relatively high temperature processing steps. Thereafter, the polishing of the substrate as is described in the above referenced patent applications is carried out. In order to fabricate the heterojunction, generally Si—Ge is utilized. To this end, for example an HBT can be fabricated. The pedestal can be the collector of the device. Alternatively, the collector can be formed epitaxially. In all cases an emitter and a base are formed thereafter through epitaxial processing steps as described above. To this end, the base is fabricated by epitaxial deposition of Si—Ge, whereas the emitter and collectors are fabricated through epitaxial deposition of silicon. Finally, in both the heterojunction and homojunction device fabrication, electrical contact to the device, passive and active devices as well as signal transmission lines and contact metallization are formed by standard techniques.

The invention having been described in detail, it is clear that other materials as well as processing steps for the fabrication of selected epitaxial layers on HMIC pedestals is within the purview of one of ordinary skill in the art. To the extent that such variations in materials and processes are within the purview of the ordinary skilled artisan, such modifications and variations are deemed within the scope of the invention disclosed herein.

We claim:

1. A process for fabricating an HMIC comprising the steps of etching silicon pedestals from a substrate; forming a dielectric material between said pedestals; and grinding the substrate said dielectric and said pedestals to a desired thickness, exposing top surfaces of said pedestals, characterized in that:

a layer of epitaxial material is deposited on at least one of said top surfaces after said forming of said dielectric and said grinding of said substrate, said dielectric and said pedestals.

2. A process as recited in claim 1 further characterized in that:

said layer of epitaxial material forms a homojunction with at least one pedestal.

3. A process is recited in claim 2 further characterized in that:

said epitaxial material is silicon.

4. A process as recited in claim 1 further characterized in that:

said epitaxial material forms a heterojunction with said at least one pedestal.

5. A process as recited in claim 4 further characterized in that:

said epitaxial material is Si—Ge.

6. A process for fabricating an HMIC comprising the steps of etching at least one silicon pedestal from a substrate; forming a layer of dielectric around said at least one pedestal; grinding said dielectric to expose a top surface of said at least one pedestal; and growing a layer of semi-conductor material on said at least one top surface.

7. A process as recited in claim 6 wherein said layer of semi-conductor material is epitaxially grown on said top surface of said at least one pedestal.

8. A process as recited in claim 7 wherein said semi-conductor material forms a homojunction.

9. A process as recited in claim 7 wherein said semi-conductor material forms a heterojunction.

10. A process as recited in claim 8 wherein said semi-conductor material is silicon.

11. A process as recited in claim 9 wherein said semi-conductor material is Si—Ge.

12. A process as recited in claim 6 further comprising the step of forming a low temperature oxide on the top surface of said dielectric; and exposing said oxide selectively to form at least one window on at least said at least one top surface of said at least one pedestal before said deposition of said semi-conductor material.

13. A process as recited in claim 12 further comprising the step of etching off polycrystalline silicon formed on said low temperature oxide.

14. A process as recited in claim 6 further comprising the steps of forming passive, inactive devices on said top surface of said dielectric and said semi-conductor material.

* * * * *